United States Patent [19]
Farwell

[11] Patent Number: 5,708,380
[45] Date of Patent: Jan. 13, 1998

[54] TEST FOR HOLD TIME MARGINS IN DIGITAL SYSTEMS

[75] Inventor: William D. Farwell, Thousand Oaks, Calif.

[73] Assignee: Hughes Electronics, Los Angeles, Calif.

[21] Appl. No.: 594,737

[22] Filed: Jan. 31, 1996

[51] Int. Cl.$^6$ .................................................. H03K 3/037
[52] U.S. Cl. ............................................ 327/202; 327/203
[58] Field of Search .................................. 327/199–203, 327/206, 208–215, 218, 225

[56] References Cited

U.S. PATENT DOCUMENTS

5,357,144  10/1994  Tanaka ................................. 327/218

FOREIGN PATENT DOCUMENTS

| 60-198916 | 10/1985 | Japan | 327/212 |
| 62-154811 | 7/1987  | Japan | 327/208 |
| 63-16710  | 1/1988  | Japan | 327/211 |
| 4-304014  | 10/1992 | Japan | 327/202 |
| 6-104701  | 4/1994  | Japan | 327/215 |

*Primary Examiner*—Timothy P. Callahan
*Assistant Examiner*—T. T. Lam
*Attorney, Agent, or Firm*—Leonard A. Alkov; Wanda K. Denson-Low

[57] ABSTRACT

A flip-flop circuit that includes a first NAND gate (11) responsive to a D input to the flip-flop circuit and a first mode control signal for providing a first NAND gate output; a second NAND gate (12) responsive to a serial scan input to the flip-flop circuit and a second mode control signal for providing a second NAND gate output; an inverter (21) responsive to the first NAND gate output for providing an inverter output; a first transmission gate responsive to the first NAND gate output and the second NAND gate output for providing a first transmission gate output, the first transmission gate output being a replica of the inverter output when the first mode control signal is of a first logical state and the second mode control signal is of a second logical state, and the first transmission gate output being of high impedance when the first mode control signal is of the second logical state and the second mode control signal is of the first logical state; a second transmission gate (32) responsive to the first NAND gate output and the second NAND gate output for providing a second transmission gate output, the second transmission gate output being a replica of the first NAND gate output when the first mode control signal is of the second logical state and the second mode control signal is of the first logical state, and the second transmission gate output being of high impedance when the first mode control signal is of a first logical state and the second mode control signal is of a second logical state; and a clocked flip-flop (41) responsive to the first transmission gate output and the second transmission gate output.

5 Claims, 1 Drawing Sheet

5,708,380

TEST FOR HOLD TIME MARGINS IN DIGITAL SYSTEMS

BACKGROUND OF THE INVENTION

The disclosed invention is directed generally to flip-flop circuits, and more particularly to a flip-flop circuit that provides for at least a predetermined hold time margin during normal operation and which provides for a reduced hold time margin during testing.

In synchronous digital logic circuitry, digital signals are propagated from one device to another by clock signals. Two critical timing parameters are setup time and hold time. Setup time defines the amount of time during which input data to a flip-flop must be stable prior to an active clock transition. Hold time defines the amount of time during which input data to a flip-flop must be stable after an active clock transition. In other words, set-up failure which occurs when the input data to a flip-flop is not stable for a predetermined amount of time prior to the active clock transition, and hold time failure which occurs when the input data to a flip-flop is not stable for a predetermined amount of time after the active clock transition.

Presently, setup time margins can be evaluated by increasing clock frequency to setup failure, and then comparing that frequency to the desired operating frequencies. However, hold time margin cannot be measured at all, since hold time margin is independent of clock frequency, and any test as to hold time can only provide a pass/fail indication. In other words, a device can pass a hold time test when it is right on the edge of hold time failure, which could result in a hold time failure during subsequent use.

It would be desirable to test for hold time margins a design. Hold time margins are an extra increment of speed performance in devices over what is used in system. For example, sufficient hold time margin might be designed so that data would be held at flip-flop inputs 10% longer than required. The use of hold time margins is sound design practice that assures reliable operation over the lifetime of a digital system.

SUMMARY OF THE INVENTION

It would therefore be an advantage to provide a flip-flop circuit that provides a measurable hold time margin.

The foregoing and other advantages are provided by the invention in a flip-flop circuit that includes a first NAND gate responsive to a D input to the flip-flop circuit and a first mode control signal for providing a first NAND gate output; a second NAND gate responsive to a serial scan input to the flip-flop circuit and a second mode control signal for providing a second NAND gate output; an inverter responsive to the first NAND gate output for providing an inverter output; a first transmission gate responsive to the first NAND gate output and the second NAND gate output for providing a first transmission gate output, the first transmission gate output being a replica of the inverter output when the first mode control signal is of a first logical state and the second mode control signal is of a second logical state, and the first transmission gate output being of high impedance when the first mode control signal is of the second logical state and the second mode control signal is of the first logical state; a second transmission gate responsive to the first NAND gate output and the second NAND gate output for providing a second transmission gate output, the second transmission gate output being a replica of the first NAND gate output when the first mode control signal is of the second logical state and the second mode control signal is of the first logical state, and the second transmission gate output being of high impedance when the first mode control signal is of a first logical state and the second mode control signal is of a second logical state; and a clocked flip-flop responsive to the first transmission gate output and the second transmission gate output. The input to the clocked flip-flop is thus provided by (a) the output of the first transmission gate when the first mode control signal is of a first logical state and the second mode control signal is of a second logical state, and (b) the output of the second transmission gate when the first mode control signal is of the second logical state and the second mode control signal is of the first logical state.

BRIEF DESCRIPTION OF THE DRAWINGS

The advantages and features of the disclosed invention will readily be appreciated by persons skilled in the art from the following detailed description when read in conjunction with the drawing wherein.

DETAILED DESCRIPTION OF THE DISCLOSURE

Figure 1:
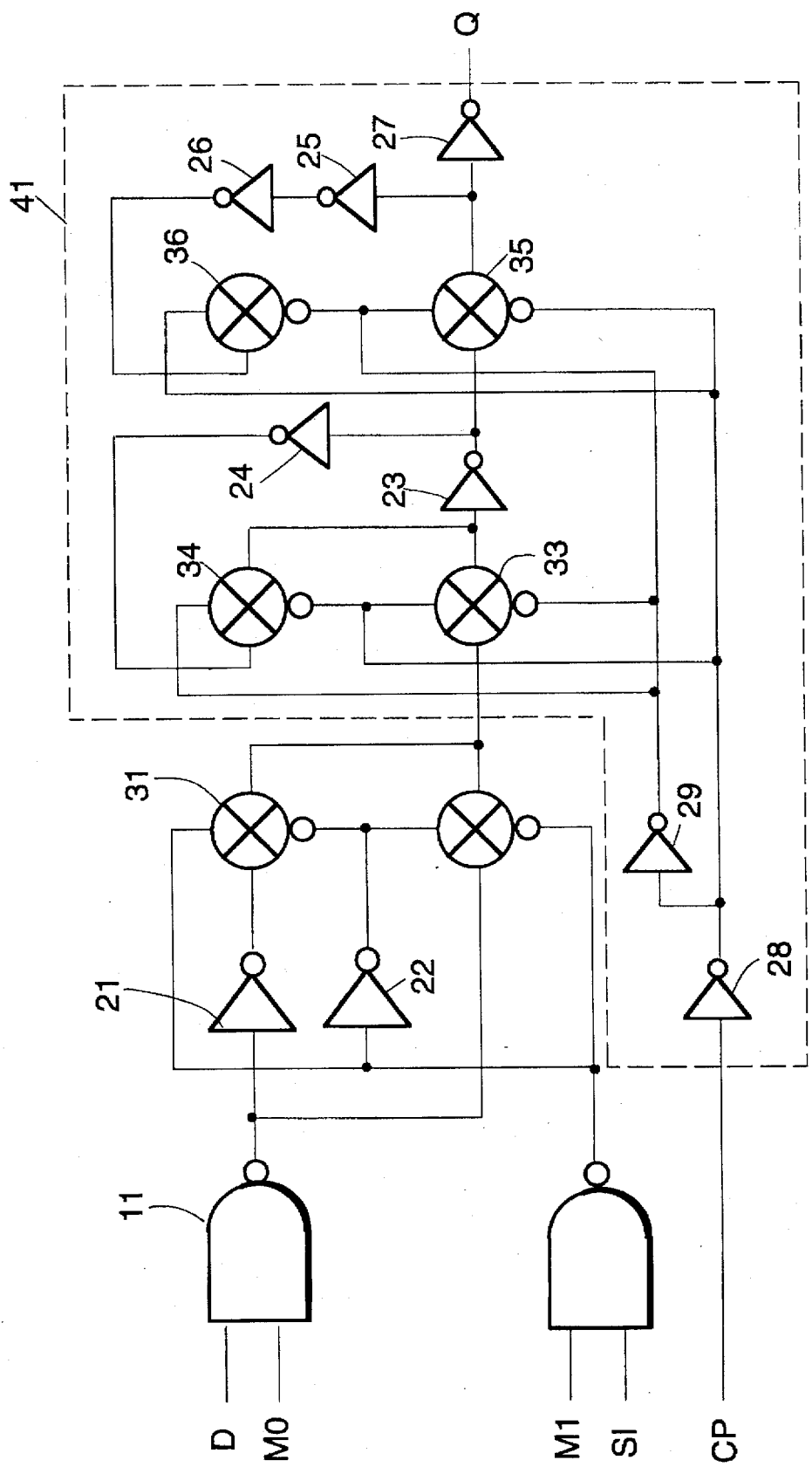
FIG. 1 is schematic diagram of a flip-flop circuit in accordance with the invention.

In the following detailed description and in the several figures of the drawing, like elements are identified with like reference numerals.

Referring now to FIG. 1, schematically set forth therein is a flip-flop circuit in accordance with the invention which includes a first NAND gate 11 having inputs for respectively receiving a D input to the flip-flop circuit and a first mode control input MO. The output of the NAND gate 11 is connected to the input of a first inverter 21 whose output is connected to the input of a first transmission gate 31. The output of the first NAND gate 11 is further connected to the input of a second transmission gate 32.

The flip-flop circuit of FIG. 1 further includes a second NAND gate 12 having inputs for respectively receiving a serial scan input SI and a second mode control input M1. In use, the serial scan input S1 would be coupled to the Q output of a similar flip-flop circuit that is prior in sequence in a scan chain in which the flip-flop circuit of FIG. 1 is implemented. The output of the second NAND gate 12 is connected to the non-inverting control input of the first transmission gate 31, the inverting control input of the second transmission gate 32, and the input of a second inverter 22. The output of the second inverter 22 is connected to the inverting control input of the first transmission gate 31 and to the non-inverting control input of the second transmission gate 32.

Each of the transmission gates 31, 32 as well as the other transmission gates in the flip-flop circuit of FIG. 1 is in a low impedance or on state when a logical 0 is applied to its inverting control input and a logical 1 is applied to its non-inverting control input. Otherwise, the transmission gate is in a high impedance state or off state. When a transmission gate is in the low impedance state, the input thereto is transmitted to its output. When a transmission gate is in the high impedance state, the input thereto is blocked from its output.

The outputs of the first and second transmission gates are tied together and connected to the input of a third transmission gate 33 which has its output connected the input of a third inverter 23. The output of the third inverter 23 is connected to the input of a fourth inverter 24 which has its output connected to the input of a fourth transmission gate 34. The output of the fourth transmission gate 34 is tied together with the output of the third transmission gate 33 and thus connected to the input of the third inverter 23.

The output of the third inverter 23 is connected to the input of a fifth transmission gate 35 which has its output connected to the input of a fifth inverter 25. The output of the fifth inverter 25 is connected to the input of a sixth inverter 26 which has its output connected to the input of a sixth transmission gate 36. The output of the sixth transmission gate 36 is tied together with the output of the fourth transmission gate 34 and thus connected to the input of the fifth inverter 23. The outputs of the fifth transmission gate 35 and the sixth transmission gate 36 is further connected to the input of a seventh inverter 27 which provides the Q output of the flip-flop circuit at its output.

An eighth inverter 28 receives a clock signal CP at its input and has its output connected to the non-inverting control input of the third transmission gate 33, the inverting control input of the fourth transmission gate 34, the inverting control input of the fifth transmission gate 34, and the non-inverting control input of the sixth transmission gate 36. The output of the eighth inverter 28 is further connected to the input of a ninth inverter 29 which has its output connected to the inverting control input of the third transmission gate 33, the non-inverting control input of the fourth transmission gate 34, the non-inverting control input of the fifth transmission gate 34, and the inverting control input of the sixth transmission gate 36.

In operation, the inverters 23 through 29 and the transmission gates 33 through 36 function as a clocked D-type flip-flop and are collectively referred to as a clocked D-type flip-flop 41. Thus, the input to the clocked D-type flip-flop 41 is provided at the input to the third transmission gate 33, and the output of the clocked D-type flip-flop 41 is provided at the output of the inverter 27 and comprises the output of the flip-flop circuit of FIG. 1. In accordance with conventional flip-flop operation, the logic signal at the input to the third transmission gate 33 is clocked to the output of the inverter 27 pursuant to an active transition of the clock signal CP so long as the logic signal at the input to the third transmission gate 33 satisfies the set up and hold time requirements of the clocked D-type flip-flop 41.

The NAND gates 11 and 12, the inverters 21 and 22, and the transmission gates 31 and 32 comprise a mode control circuit that defines the input to the clocked D-type flip-flop 41. The modes of operation are summarized as follows as function of the logic levels of the mode control signals M0 and M1:

| M0 | M1 | MODE |
|---|---|---|
| 0 | 0 | Synchronous Clear |
| 0 | 1 | SI (Serial Scan) |
| 1 | 0 | D |
| 1 | 1 | SI XOR D (Built In Self Test) |

In the Synchronous Clear mode, the outputs of the NAND gates are logical 1s regardless of the logical states of the D and SI signals. Thus, the first transmission gate 31 is in the low impedance state while the second transmission gate 32 is in the high impedance state, and the input to the clocked D-type flip-flop 41 is a replica of the output of the first inverter 21 which is a logical 0 regardless of the logical state of the D input to the flip-flop circuit. Accordingly, in the Synchronous Clear mode, the input to the clocked D-type flip-flop 41 is a logical 0 regardless of the states of the D and SI inputs to the flip-flop circuit of FIG. 1.

In the SI or Serial Scan mode, the output of the first NAND gate 11 is a logical 0 regardless of the state of the D input. The output of the second NAND GATE 12 is the inverse of the serial scan SI input. Thus, when SI is a logical 0, the first transmission gate 31 is in the high impedance state, the second transmission gate 32 is in the low impedance state, and the input to the clocked flip-flop 41 comprises the logical 0 output of the first NAND gate 11. When SI is a logical 1, the first transmission gate 31 is in the low impedance state, the second transmission gate 32 is in the high impedance state, and the input to the clocked D-type flip-flop 41 comprises the logical 1 output of the first inverter 21. Accordingly, in the SI or Serial Scan mode, the input to the clocked D-type flip-flop 41 comprises a replica of the SI input. In the D mode, the output of the second NAND gate 12 is a logical 0 regardless of the state of the SI input. The output of the first NAND GATE 11 is the inverse of the D input. Thus, the first transmission gate 31 is in the low impedance state, the second transmission gate 32 is in the high impedance state, and the output of the first inverter 21 comprises the input to the clocked D-type flip-flop 41. Accordingly, in the D mode, the path from the D input to the clocked D-type flip-flop 41 includes the delay of the first inverter 21.

In the Built In Self Test (BIST) mode, the output of the first NAND gate 11 is a logical inverse of the D input, and the output of the second NAND is a logical inverse of the SI input. When the SI input is a logical 0, the output of the second NAND gate 12 is a logical 1, the first transmission gate 31 is in the low impedance state, the second transmission gate 32 is in the high impedance state, and the input to the clocked D-type flip-flop 41 is provided by the output of the first inverter 21. When the SI input is a logical 1, the output of the second NAND gate 12 is a logical 0, the first transmission gate 31 is in the high impedance state, the second transmission gate 32 is in the low impedance state, and the input to the clocked D-type flip-flop 41 is provided by the output of the first NAND gate 11. Thus, in the BIST mode, the input to the clocked D-type flip-flop 41 is logically equal to (D .XOR.SI), and when SI is a logical 1, the delay path of the D input is decreased by one inverter with respect to the D-mode of operation. Accordingly, when SI is a logical 1 in the BIST mode, the hold time requirement of the D input is increased by one inverter delay relative to the D mode of operation as a result of omission of the inverter 21 in the path of the D input.

The hold time margin of the flip-flop circuit of FIG. 1 is therefore tested in the course of BIST testing wherein pseudo-random patterns are applied to the D input and the SI input. In particular, the hold time requirement is increased 50% of the time during pseudo-random testing, and if the values of the Q output of the flip-flop circuit are equal to the expected responses to the pseudo-random patterns, then the hold time margin of the flip-flop circuit of FIG. 1 is at least equal to the delay of the first inverter 21.

It is noted that in the BIST mode of operation, when SI is a logical 1, the setup time requirement for the flip-flop circuit is reduced. However, setup time is properly tested when SI is a logical 0, which is 50% of the time during pseudo-random testing.

Referring further to clocked D-type flip-flop 41, the third transmission gate 33, the fourth transmission gate 34, the third inverter 23, and the fourth inverter 24 comprise a first latch that is (a) transparent when the clock signal CP is low and (b) holding when the clock signal is high. The fifth transmission gate 35, the sixth transmission gate 36, the fifth inverter 25, and the sixth inverter 26 comprise a latch that is (a) holding when the clock signal CP is low and (b) transparent when the clock signal is high. When the clock signal CP transitions from low to high, the output of the third inverter 23 remains at the inverse of the logic level that was set up at the input to the third transmission gate 33 at the time the clock signal CP transitions from low to high, and the output of the seventh inverter 23 changes to the inverse of the output of the third inverter. When the clock signal CP transitions from high to low, the output of the seventh inverter 27 remains at the inverse of the logic level provided by the output of the third inverter 23 pursuant to the prior low to high transition of the clock signal CP, and the output of the third inverter 23 will inversely follow the logic level at the input of the third transmission gate 33.

Thus, inputs at the input of the third transmission gate 33 are transferred to the output of the seventh inverter 27 on the positive going transitions of the clock signal CP.

The foregoing has been a disclosure of flip-flop circuit as to which a hold time minimum hold time margin is advantageously determined with existing Built In Self Test methods and without the use of additional test modes or test lines.

Although the foregoing has been a description and illustration of specific embodiments of the invention, various modifications and changes thereto can be made by persons skilled in the art without departing from the scope and spirit of the invention as defined by the following claims.

What is claimed is:

1. A flip-flop circuit comprising:
   a first NAND gate responsive to a D input to the flip-flop circuit and a first mode control signal for providing a first NAND gate output;
   a second NAND gate responsive to a serial scan input to the flip-flop circuit and a second mode control signal for providing a second NAND gate output;
   an inverter responsive to said first NAND gate output for providing an inverter output;
   first transmission means responsive to said first NAND gate output and said second NAND gate output for providing a first transmission output, said first transmission means output being a replica of said inverter output when said first mode control signal is of a first logical state and said second mode control signal is of a second logical state, and said first transmission means output being of high impedance when said first mode control signal is of the second logical state and said second mode control signal is of the first logical state;
   second transmission means responsive to said first NAND gate output and said second NAND gate output for providing a second transmission means output, said second transmission means output being a replica of said first NAND gate output when said first mode control signal is of the second logical state and said second mode control signal is of the first logical state, and said second transmission means output being of high impedance when said first mode control signal is of a first logical state and said second mode control signal is of a second logical state;
   a clocked D-type flip-flop responsive to said first transmission means output and said second transmission means output;
   whereby (a) said clocked D-type flip-flop is responsive to said first transmission means output when said first mode control signal is of said first logical state and said second mode control signal is of said second logical state, and (b) said clocked D-type flip-flop is responsive to said second transmission means output when said first mode control signal is of the second logical state and said second mode control signal is of the first logical state.

2. The flip-flop circuit of claim 1 wherein said first transmission means comprises a first transmission gate, and wherein said second transmission means comprises a second transmission gate.

3. A flip-flop circuit comprising:
   a first NAND gate responsive to a D input to the flip-flop circuit and a first mode control signal for providing a first NAND gate output;
   a second NAND gate responsive to a serial scan input to the flip-flop circuit and a second mode control signal for providing a second NAND gate output;
   a clocked D-type flip-flop having an input for receiving a flip-flop input;
   mode selection means responsive to said first NAND gate output and said second NAND gate output for providing between said first NAND gate output and said flip-flop input a path that (a) includes an inverter delay when said first mode control signal is of a second logical state and said second mode control signal is of a first logical state, said inverse replica of the D input (b) excludes said inverter delay when said first mode control signal is of said first logical state and said second mode control signal is of said second logical state, said replica of the D input.

4. The flip-flop circuit of claim 3 wherein said mode selection means comprises:
   an inverter responsive to said first NAND gate output for providing an inverter output;
   first transmission means responsive to said first NAND gate output and said second NAND gate output for providing a first transmission output, said first transmission means output being a replica of said inverter output when said first mode control signal is of said first logical state and said second mode control signal is of said second logical state, and said first transmission means output being of high impedance when said first mode control signal is of the second logical state and said second mode control signal is of the first logical state;
   second transmission means responsive to said first NAND gate output and said second NAND gate output for providing a second transmission means output, said second transmission means output being a replica of said first NAND gate output when said first mode control signal is of the second logical state and said second mode control signal is of the first logical state, and said second transmission means output being of high impedance when said first mode control signal is of said first logical state and said second mode control signal is of said second logical state;
   said first transmission gate output and said second transmission gate output being connected to said clocked D-type flip-flop input.

5. The flip-flop circuit of claim 4 wherein said first transmission means comprises a first transmission gate, and wherein said second transmission means comprises a second transmission gate.

* * * * *